United States Patent
Redshaw et al.

(10) Patent No.: US 11,408,625 B2
(45) Date of Patent: Aug. 9, 2022

(54) COOLING SYSTEM MONITORING

(71) Applicant: EkkoSense Ltd., Lincoln (GB)

(72) Inventors: Stuart Redshaw, Nottingham (GB); Dean Boyle, Nottingham (GB); Paul Milburn, Nottingham (GB); David Corder, Nottingham (GB)

(73) Assignee: EKKOSENSE LTD., Lincoln (GB)

( * ) Notice: Subject to any disclaimer, the term of this patent is extended or adjusted under 35 U.S.C. 154(b) by 245 days.

(21) Appl. No.: 16/643,268

(22) PCT Filed: Aug. 30, 2018

(86) PCT No.: PCT/GB2018/052446
§ 371 (c)(1),
(2) Date: Feb. 28, 2020

(87) PCT Pub. No.: WO2019/043387
PCT Pub. Date: Mar. 7, 2019

(65) Prior Publication Data
US 2020/0333031 A1 Oct. 22, 2020

(30) Foreign Application Priority Data
Aug. 30, 2017 (GB) .................................... 1713862

(51) Int. Cl.
F24F 11/46 (2018.01)
H05K 7/20 (2006.01)
(52) U.S. Cl.
CPC .............. F24F 11/46 (2018.01); H05K 7/207 (2013.01)
(58) Field of Classification Search
None
See application file for complete search history.

(56) References Cited

U.S. PATENT DOCUMENTS 7,031,870 B2   4/2006  Sharma et al.
8,538,584 B2 * 9/2013  Pandey ............... G05D 23/00
                                             700/275

(Continued)

FOREIGN PATENT DOCUMENTS

CN    204985014 U    1/2016
GB      2476581 A    6/2011
WO   2010077253 A1   7/2010

OTHER PUBLICATIONS

Li, H, & Hamann, HF. "A Statistical Approach to Thermal Zone Mapping." Proceedings of the ASME 2011 Pacific Rim Technical Conference and Exhibition on Packaging and Integration of Electronic and Photonic Systems, MEMS and NEMS: vol. 2. Portland, Oregon, USA. Jul. 6-8, 2011. (Year: 2011).*

(Continued)

Primary Examiner — Kenneth M Lo
Assistant Examiner — Istiaque Ahmed
(74) Attorney, Agent, or Firm — David D. Brush; Westman, Champlin & Koehler, P.A.

(57) ABSTRACT

Automatic monitoring of a cooling system and providing warnings of abnormal operation. The cooling system includes one or more air handling units to provide air flow cooling to a plurality of racks of computer equipment, each rack having a display module for indicating an inlet air temperature of the rack and an alert message. The monitoring includes: receiving, from a plurality of sensors, measurements of: an air flow temperature provided to each of the racks; and an air pressure, temperature and relative humidity difference across, and an electrical power consumption of, the air handling unit(s); updating a computer model of the cooling system with the received measurements; and for each rack, if a level or a rate of change of the inlet air temperature is outside of a preset range for the rack, trans- (Continued)

mitting an alert message to the display module to indicate a cause based on the computer model.

15 Claims, 5 Drawing Sheets

(56) References Cited

U.S. PATENT DOCUMENTS

| | | | |
|---|---|---|---|
| 10,180,261 B1* | 1/2019 | Ross | F24F 11/62 |
| 2005/0024826 A1* | 2/2005 | Bash | H05K 7/20836 |
| | | | 361/695 |
| 2007/0163748 A1* | 7/2007 | Rasmussen | F16L 3/24 |
| | | | 165/53 |
| 2012/0303166 A1 | 11/2012 | Chang | |
| 2015/0134123 A1* | 5/2015 | Obinelo | F24F 11/30 |
| | | | 700/277 |
| 2016/0234972 A1 | 8/2016 | Billet et al. | |
| 2016/0249487 A1* | 8/2016 | Bhagwat | G06F 1/20 |

OTHER PUBLICATIONS

International Search Report dated Oct. 29, 2018 for corresponding International Application No. PCT/GB2018/052446, filed Aug. 30, 2018.

Written Opinion of the International Searching Authority dated Oct. 29, 2018 for corresponding International Application No. PCT/GB2018/052446, filed Aug. 30, 2018.

GB Search and Exam Report dated Nov. 10, 2017 for corresponding GB Application No. 1713862.9, filed Aug. 30, 2017.

* cited by examiner

COOLING SYSTEM MONITORING

CROSS-REFERENCE TO RELATED APPLICATIONS

This Application is a Section 371 National Stage Application of International Application No. PCT/GB2018/052446, filed Aug. 30, 2018, which is incorporated by reference in its entirety and published as WO 2019/043387 A1 on Mar. 7, 2019, in English.

FIELD OF THE INVENTION

The invention relates to automatic monitoring of a cooling system, and providing warnings in the event of abnormal operation.

BACKGROUND

Modern data centres perform a central function in enabling operation of services connected over the internet, and a key requirement is that data centres must have a high degree of availability. To maintain operation, it is important to keep each item of equipment in a data centre within its operational parameters. A key operational parameter is temperature. Cooling is therefore a central feature of data centre design. A typical design will involve one or more air handling units (AHUs) and multiple rows of equipment racks arranged along aisles. Cooling air can be provided by the AHUs via ventilation paths within the floor and/or within the ceiling of the centre, providing air at a desired temperature to each rack. Each rack may have its own optimal temperature for supplied air, depending on the power rating of the rack and the sensitivity of the equipment.

A large proportion of the power required for a typical data centre is the power required for cooling. It is therefore important to ensure that cooling power is kept to a minimum to ensure efficient operation. This can be a challenge, particularly when equipment racks are under variable load or are frequently changed. Ensuring that all racks receive cooling at a desired level may require the AHUs to operate at a higher power than would strictly be required so that adequate cooling can be provided to all racks. If operating close to the operating limit of each equipment rack, for example, and the air inlet temperature of any particular rack exceeds a desired limit, the cause may not be obvious and the only quick solution, barring a redesign of the centre, can be to increase the cooling power to all racks.

SUMMARY OF THE INVENTION

In accordance with a first aspect of the invention there is provided a method of monitoring a cooling system comprising one or more air handling units configured to provide air flow cooling to a plurality of racks of computer equipment, each rack having a display module for indicating an inlet air temperature of the rack and an alert message, the method comprising:
receiving, from a plurality of sensors, measurements of:
an air flow temperature provided to each of the plurality of racks; and
an air pressure, temperature and relative humidity difference across, and an electrical power consumption of, the one or more air handling units;
updating a computer model of the cooling system with the received measurements; and
for each rack, if a level or a rate of change of the inlet air temperature is outside of a preset range for the rack, transmitting an alert message to the display module to indicate a cause based on the computer model.

An advantage of the invention is that sensor data measured throughout the cooling system can be used to provide an indication of the cause of an air inlet temperature being outside of a nominal range, enabling a user to more easily and quickly track the possible cause and resolve the problem. This may also allow action to be taken before operation of the cooling system falls outside nominal parameters by setting the nominal range accordingly. The invention may also allow notification of any unplanned changes, such as operation of AHUs or changing set points out of normal change control procedures.

A further advantage of the invention is of providing diagnostic information at a location where it is needed, i.e. at the particular rack where an issue has been identified, allowing corrective action to be taken sooner than would otherwise be possible. The process of analysing the sensor data and determining a cause of any issue that may need an alert to be displayed is carried out by a computer system remote from each display module, allowing each display module to be a relatively simple and inexpensive unit.

The alert message may be transmitted if the level or rate of change of temperature exceeds a preset limit for the rack. In some cases, however, an alert message may be transmitted if the level or rate of change is below a preset limit for the rack. Over-cooling is also a problem that needs to be resolved, since this indicates a waste of power.

The method may comprise transmitting a signal to the display module on each rack to indicate the inlet air temperature of the rack. In other examples, the display module may be configured to measure the inlet air temperature of the associated rack, for example using a connected temperature measurement sensor. In such examples, the air flow temperature for each of the plurality of racks may be measured and transmitted by the display module for that rack. In alternative examples the air inlet temperature may be measured and transmitted by a separate sensor.

The alert message may be derived by the computer model from a correlation over time between the inlet air temperature for the rack and one of the received measurements. The computer model may select the measurement having the highest correlation with the inlet air temperature for the rack, the alert message indicating a location from which the measurement was taken.

The computer model may select a plurality of measurements having the highest correlation with the inlet air temperature for the rack, the alert message indicating the locations for the respective plurality of measurements in order of correlation.

A measure of correlation may be determined for each inlet air temperature against each measurement from the plurality of sensors over a preceding period of time. The measure of correlation may be determined from frequency analysis of pairs of data sets, each data set pair comprising time varying data of an air inlet temperature and a sensor measurement. The measure of correlation may be stored in a table from which the correlation over time between the inlet air temperature for the rack and one of the received measurements is obtained.

The air handling unit with a sensor measurement having the highest correlation with the air inlet temperature may be identified as the cause.

The alert message may be transmitted to the display module to indicate the cause of the threshold being exceeded as being the rack.

Each display module may transmit a first indication of its location, and a comparison may be made between the first indication and a second indication of a location of the display module in the computer model, the display module displaying an alarm if the first and second indications do not match.

In accordance with a second aspect of the invention there is provided a computer program comprising instructions for causing a computer to perform the method according to the first aspect.

DESCRIPTION OF THE DRAWINGS

The invention is described in further detail below by way of example and with reference to the accompanying drawings, in which.

DETAILED DESCRIPTION OF ILLUSTRATIVE EMBODIMENTS

Figure 1:
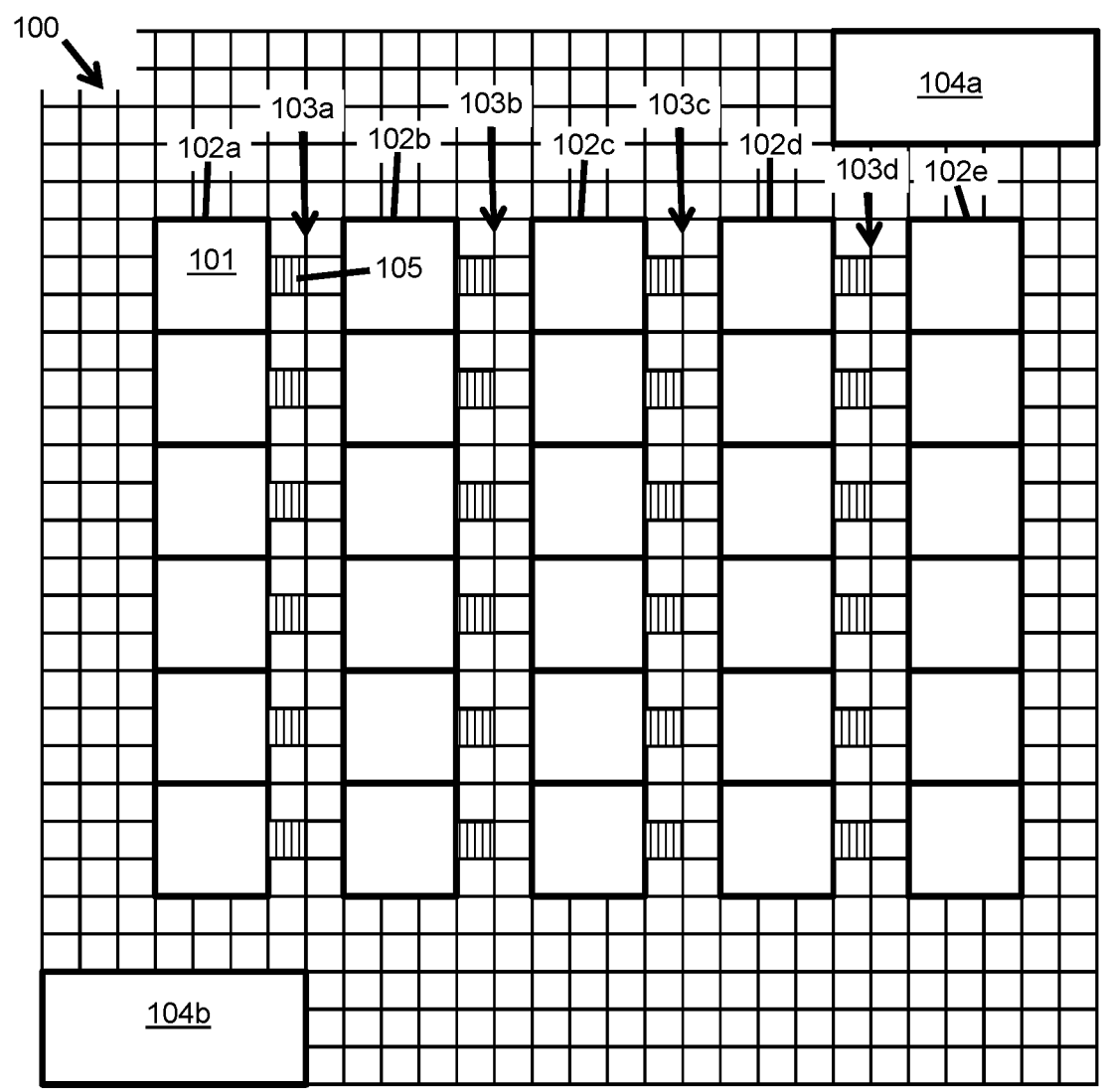
FIG. 1 is a simplified schematic drawing of a plan view of an example data centre.

FIG. 1 is a schematic plan view drawing of a simplified data centre 100, in which equipment racks 101 are arranged in rows 102a-e separated by aisles 103a-d. Air handling units 104a, 104b provide a supply of cooling air to the racks 101. The floor of the data centre 100 is arranged in a regular grid, with each grid element being a removable tile that can be either solid or in the form of a vent 105 to allow the entry or exit of air. Cooling air will typically be provided via ventilation channels provided beneath the floor to each equipment rack, airflow being delivered by floor vents near to, or directly underneath, each rack. Cooling air may alternatively be provided by ambient airflow when no underfloor ventilation is present. Cooling air passes through the racks, is exhausted and then drawn back into the system through vents or via ambient airflow. Vents 104 may be arranged within each aisle 103a-d to either supply cooling air or exhaust cooling air from a row 102a-e of racks 101. Vents may also, or alternatively, be provided in the ceiling to direct airflow back towards the AHUs.

A plurality of sensors (not shown) is provided throughout the data centre 100 for measuring various parameters related to the items of equipment. Air pressure, temperature and relative humidity difference across, and electrical power consumption of, each of the AHUs 104a, 104b is measured. This enables a measure of cooling power and efficiency to be determined for each AHU. A measure of air flow inlet temperature provided to each of the equipment racks 101 is also measured. Air flow outlet temperature of each rack may also be measured. Other measurements may also be made throughout the data centre, for example to measure air flow and temperature at various points throughout the ventilation system. The sensor measurements may be used by the computer model to determine a 'zone of influence' for each AHU, i.e. determining the extent to which each AHU influences the airflow inlet temperature of racks within a certain distance.

Figure 2:
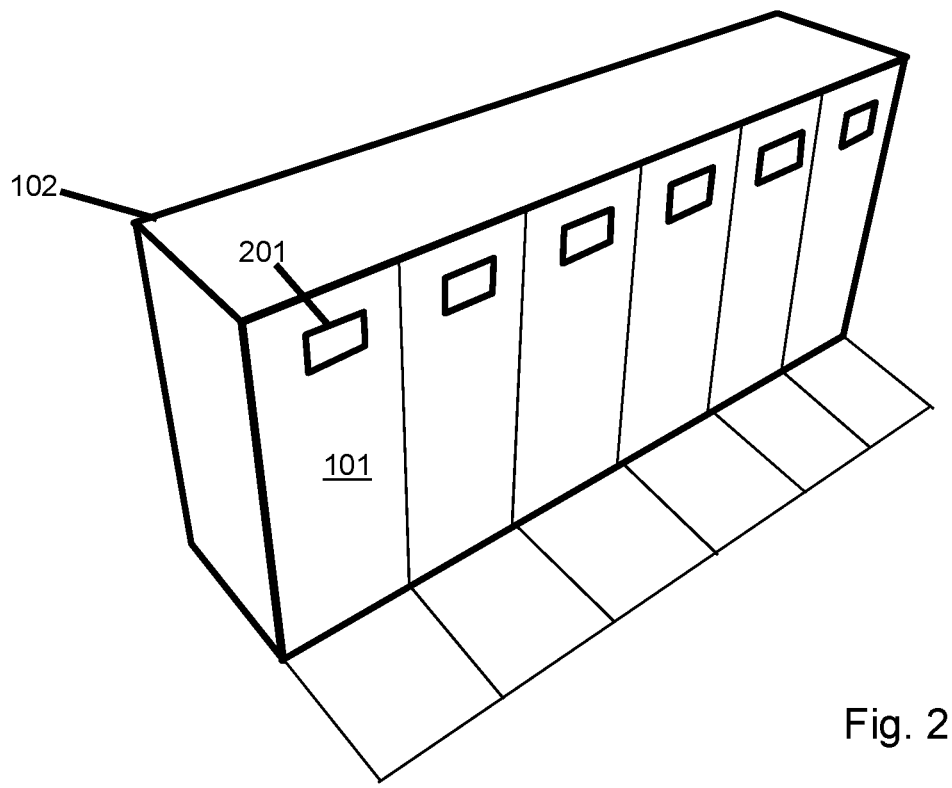
FIG. 2 is a schematic perspective view of an example row of equipment racks within a data centre.

A schematic drawing of an example row 102 of equipment racks is shown in FIG. 2. A display module 201 is provided on a vertical face of each rack 101. The display module 201 is arranged to indicate an inlet air temperature of the rack 101, along with an alert message. During normal operation the display module 201 may just display the inlet air temperature. In the event the air inlet temperature lies outside of a nominal range, for example if it exceeds a preset upper limit, the display module displays an alert message that indicates to a user what action could be taken to rectify the issue. This alert message is provided wirelessly to the display module from a computer system that maintains a model of the data centre, the model being populated with sensor data relating to operation of the data centre.

The display modules 201 may form a wirelessly connected network of nodes, which feeds data to, and acquires data from, the computer model monitoring the data centre. Each module 201 may be battery powered and may utilise a low power wireless connection to transmit and receive data. Each module 201 may be configured to measure a local temperature, for example the air inlet temperature of the rack to which the module is attached, or alternatively may receive an indication of the temperature of the rack wirelessly.

Figure 3:
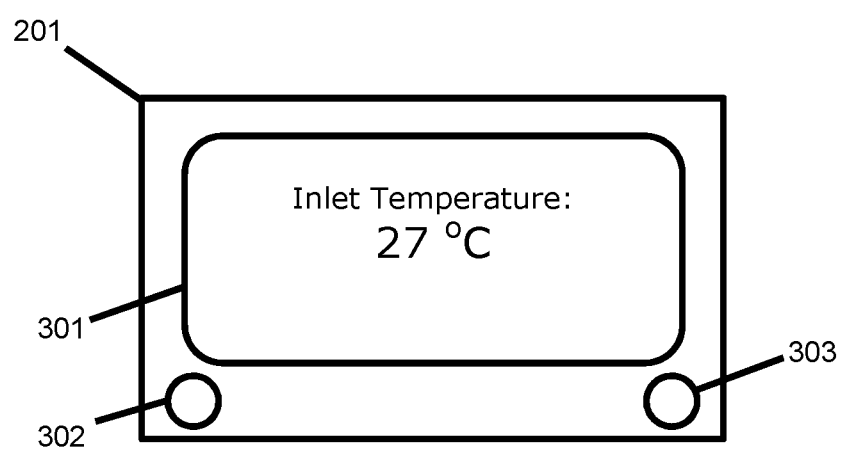
FIG. 3 is a schematic drawing of an example of a display module for indicating an inlet air temperature of an equipment rack and an alert message.
Figure 4:
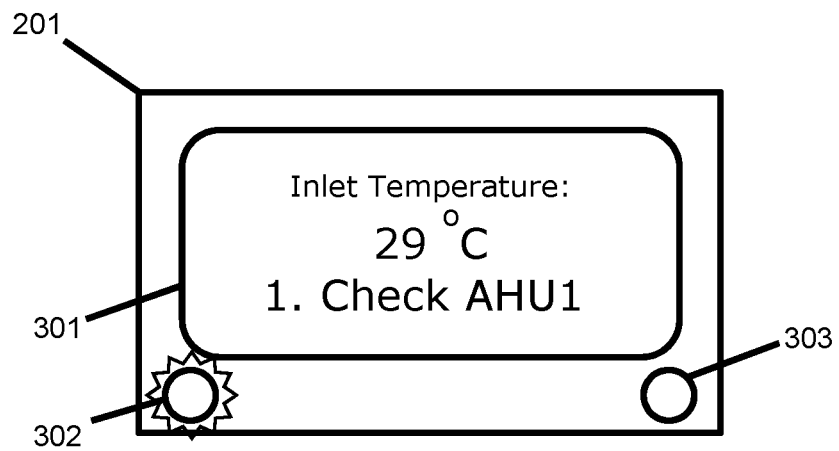
FIG. 4 is a schematic drawing of the display module of FIG. 3 when an alert message is being displayed

An example of a display module 201 is shown in FIG. 3 during normal operation. The module 201 has a display screen 301 on which the inlet temperature is displayed, which in this case is indicated as 27° C. The module may also comprise an indicator light 302 and a control interface, which may be as simple as a single button 303. In the event the inlet temperature is outside the preset range, the module may cause the indicator light 302 to illuminate, indicating to a user that there is a problem with the associated rack that needs to be resolved. FIG. 4 shows the module when the inlet temperature exceeds the preset limit. The display screen 301 shows the inlet temperature and an alert message that indicates an action a user can take to resolve the issue. In this case, the user is instructed to check one of the air handling units. The button 303 may be used to scroll through a series of alerts that can be displayed on the module, which may be arranged in order of decreasing likelihood of the cause of the temperature exceeding the limit.

The module 201 may be configured to receive text-based messages sent from a server, which may identify the module 201 based on prior knowledge of an association between its unique ID and its physical location. A wireless network connecting a plurality of modules may be optimised for low power operation, which can result in a delay in messages reaching each display sensor, but this delay may be of the order of seconds or minutes and is therefore unlikely to be noticeable or to affect efficient operation of the alert system.

The module 201 could be configured to display a preprogrammed message from a list of messages stored locally in memory. This would only require an index number for any given message, potentially saving time and energy.

The module may comprise a sensor for detecting whether the rack to which the module is attached has been opened. The sensor may for example be an accelerometer, or may be a magnetic door sensor switch attached to the rack door and frame. The module can then determine, and transmit to the computer model, when the associated rack has been opened. The computer model can use this data entry as a possible candidate if a temperature alert follows soon after such an event.

Figure 5:
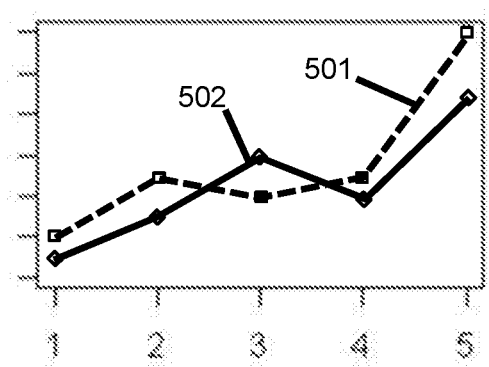
FIG. 5 is a simplified example plot of two measurements over time having a correlation with each other.

A computer model of the data centre is maintained and updated with sensor data received from the cooling system. The computer model may comprise a table or database of sensor data received over time from the data centre, with each set of sensor data being associated with a particular item of equipment. This data can be used to determine the most likely cause or causes of the inlet air temperature of any one of the racks being exceeded. FIG. 5 illustrates in simplified form an example of how this may be done. A first plot 501 shows AHU cooling duty (typically measured in kW) as a function of time (shown as samples 1-5), while a second plot 502 shows rack temperature as a function of time. The plots are each scaled to a common y-axis to enable comparison. For a typical data centre, there may be hundreds or thousands of measurements being taken over any given sampling period. By making a statistical comparison of the air inlet temperature with all available data, one or more correlations may be made with the air inlet temperature data. A strong correlation, such as that shown in FIG. 5, indicates a likelihood of a cause of the air inlet temperature increase. In this case, the rise in cooling duty of the AHU along with the air inlet temperature indicates that this may be a cause. An alert message may therefore be sent to the display module associated with the particular rack indicating that operation of the particular AHU should be checked.

Statistical analysis of the various measured parameters with the inlet air temperature may also be arranged to look for negative as well as positive correlations. For example, air flow rate at particular points throughout the data centre may negatively correlate with inlet air temperature. If air flow is restricted at a particular point, this may result in the inlet air temperature rising for an associated equipment rack. The alert message may then indicate a particular point in the ventilation path to check for obstructions.

Some correlations may be more generic, based on past knowledge of how equipment in data centres tends to interact, one example being that lower than necessary temperatures on some racks in combination with a higher temperature on others can imply an incorrect airflow balance. Other correlations could be learned by the computer model as problems are encountered and then resolved. For example, a set of racks could be suffering from undercooling (detected by excessively high air outlet temperatures) which may be subsequently found to have been caused by a problem with an air handling unit (manifested by low temperature difference between inlet and outlet despite high fan current—i.e. a fan fault). If this diagnosis is fed back into the software then the next time the pattern appears, even if it is for a different rack, it can be suggested as a possible cause of the fault. Such information may be kept and used solely for a particular cooling system, or alternatively may be anonymised and used across a plurality of different cooling systems. A datacentre optimisation process, which is often performed once monitoring equipment has been installed, may provide valuable information on the dynamics of the cooling performance versus operating conditions for the air handling units, which could also be fed into the computer model. Observations such as what effect disconnecting any one of the air handling units has on a given set of racks may be incorporated into the model.

A further source of diagnostic data is a comparison between electrical power consumed by the servers in each rack (based on the power distribution unit supplying each rack) and an air temperature rise between the inlet and outlet for the rack. If the air temperature difference tracks the electrical power consumption for a particular rack, this would indicate normal behaviour. However, an increase in air temperature difference without a corresponding increase in power consumption would tend to suggest a reduced airflow.

Figure 6:
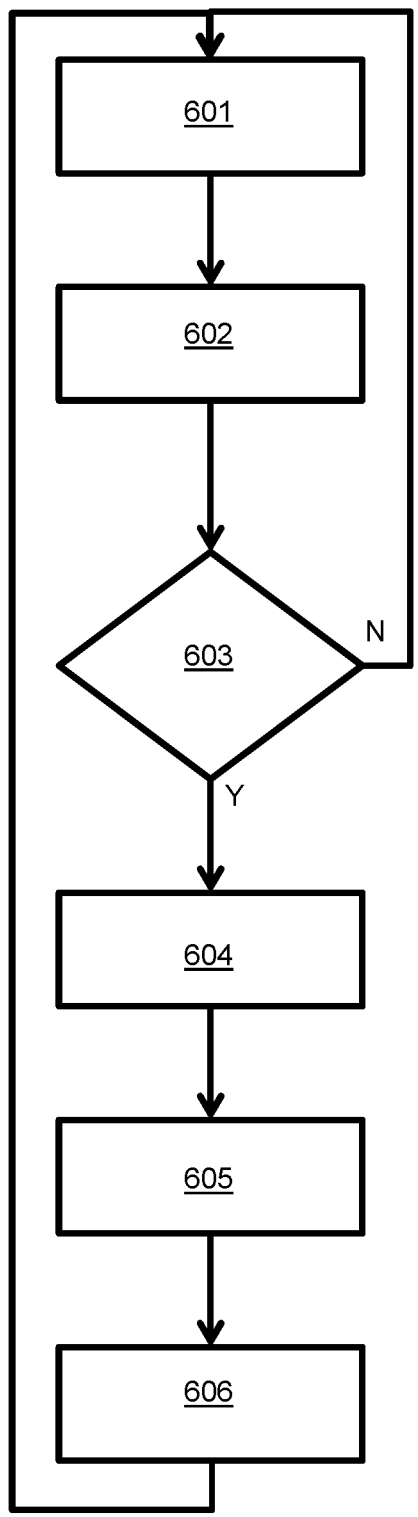
FIG. 6 is a flow chart illustrating an example method of operation.

FIG. 6 illustrates a simplified flow chart of an example method of operation. In step 601, sensor data is received from a plurality of sensors throughout the data centre. In step 602, the computer model of the data centre is updated. In step 603 a check is made to determine whether any of the measured air inlet temperatures in each of the racks is outside a preset range. If all of the measured air inlet temperatures are nominal, the process repeats by receiving further sensor data. If an air inlet temperature does lie outside the preset range, the process proceeds to step 604, where a correlation is run between the air inlet temperature in question and sensor data measured over time from throughout the data centre. At step 605, the best correlation is selected, and at step 606 an alert message corresponding to the best correlation is sent to the display module associated with the particular equipment rack.

A minimum level of correlation may be set, such that only high correlations result in an alert message, in order to avoid false or misleading alert messages. If no good correlation can be found, this may indicate that there is a problem with the equipment rack in question. An alert message may then be sent indicating that the rack itself should be checked.

Step 604 of the method may be carried out on a regular basis for all of the measured air inlet temperatures, using data recorded over a previous period, and may not therefore need to be done each time a measured air inlet temperature is determined to be out of range. A table can be created or updated based on measured correlations between the temperature of each air inlet and the various sensor measurements. The table may, for example, indicate a relative level of correlation between each measured air inlet temperature and each sensor measurement over a period of time. The table can then be referred to when an air inlet temperature has been determined to be out of range and the piece of equipment with a sensor measurement having the highest correlation identified as a likely cause of the anomaly.

The method of correlating air inlet temperatures with sensor measurements may involve carrying out frequency analysis on pairs of time-varying data sets. Using Fourier transforms of pairs of data sets, the different frequency components of each data set can be compared and a correlation value determined. To take a simple example, an air inlet temperature in close proximity to an air handling unit is likely to be inversely correlated with the power consumption of the air handling unit, and much less correlated with sensor measurements from other air handling units further away. Each air handling unit will therefore tend to have a zone of influence covering multiple air inlets, with these zones tending to have overlapping boundaries. Correlations may also have a time shift, for example where an operating parameter of a particular air handling unit is changed and its effect is not felt by an air inlet within the air handling unit's zone of influence until later. The method of correlating air inlet temperatures with sensor measurements may therefore also take into account time delays between pairs of data sets.

Figure 7:
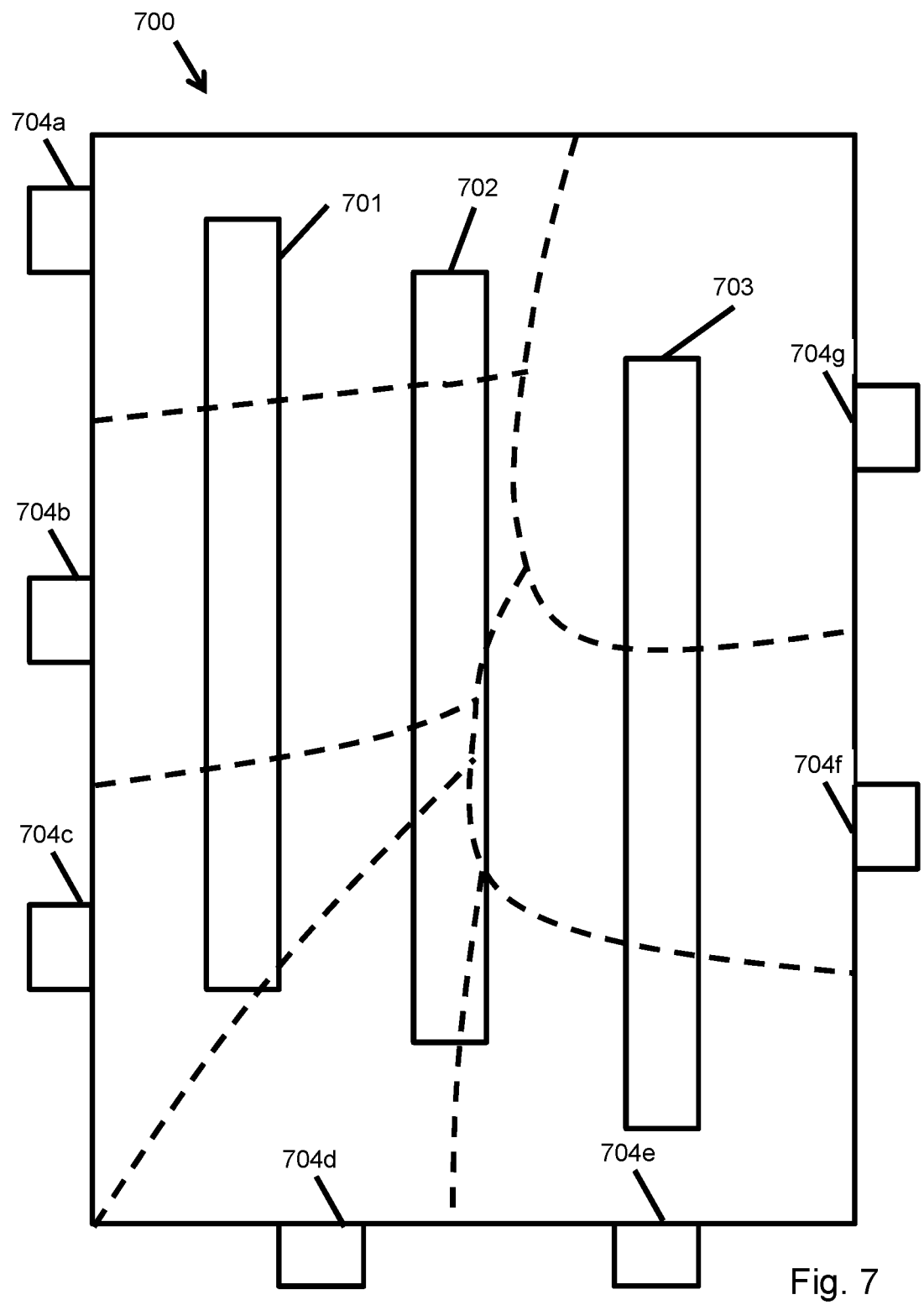
FIG. 7 is a schematic plan view of an example data centre having multiple air handling units and multiple rows of equipment racks.

FIG. 7 illustrates schematically a plan view of an example simplified layout of a data centre 700, in which rows of equipment racks 701-703 are arranged within a ventilated room, with ventilation supplied by air handling units 704a-g. Each air handling unit 704a-g will tend to be associated with zones of influence, the boundaries of which are indicated in FIG. 7 by dotted lines. Any air inlet temperatures within a zone of influence will tend to be correlated with the respective air handling unit, as determined by the degree to which each inlet temperature is correlated with the sensor measurements of each air handling unit. The physical distance between each air inlet and each air handling unit may also be taken into account in determining a correlation value for each air inlet temperature series, with air handling units closer to the air inlet being weighted more highly than those further away.

To determine which zone of influence a particular rack lies within, a series of calculations may be performed. The m racks may be identified as R1, R2, R3 . . . Rm, while the n air handling units (AHUs) may be identified as A1, A2, A3 . . . An and the cooling capacities of the AHUs as $kW_{A1}$, $kW_{A2}$, $kW_{A3}$ . . . $kW_{An}$. The coordinates of each of the racks and AHUs on an x-y plane may be defined as:

Racks: R1 $(x_{R1}, y_{R1})$, R2 $(x_{R2}, y_{R2})$, R3 $(x_{R3}, y_{R3})$, . . . , Rm $(x_{Rm}, y_{Rm})$, AHUs: A1 $(x_{A1}, y_{A1})$, A2 $(x_{A2}, y_{A2})$, A3 $(x_{A3}, y_{A3})$, . . . , An $(x_{An}, y_{An})$, The linear distance between each AHU to each rack in the data centre may be defined as $D_{A1R1}$, $D_{A1R2}$, $D_{A1R3}$, $D_{A1R4}$ . . . .

For AHU-1:

$$D_{A1R1} = \sqrt{(x_{A1}-x_{R1})^2 + (y_{A1}-y_{R1})^2}$$

$$D_{A1R2} = \sqrt{(x_{A1}-x_{R2})^2 + (y_{A1}-y_{R2})^2}$$

$$D_{A1R3} = \sqrt{(x_{A1}-x_{R3})^2 + (y_{A1}-y_{R3})^2}$$

. . .

$$D_{A1Rm} = \sqrt{(x_{A1}-x_{Rm})^2 + (y_{A1}-y_{Rm})^2}$$

For AHU-2:

$$D_{A2R1} = \sqrt{(x_{A2}-x_{R1})^2 + (y_{A2}-y_{R1})^2}$$

$$D_{A2R2} = \sqrt{(x_{A2}-x_{R2})^2 + (y_{A2}-y_{R2})^2}$$

$$D_{A2R3} = \sqrt{(x_{A2}-x_{R3})^2 + (y_{A2}-y_{R3})^2}$$

. . .

$$D_{A2Rm} = \sqrt{(x_{A2}-x_{Rm})^2 + (y_{A2}-y_{Rm})^2}$$

For AHU-n:

$$D_{AnR1} = \sqrt{(x_{An}-x_{R1})^2 + (y_{An}-y_{R1})^2}$$

$$D_{AnR2} = \sqrt{(x_{An}-x_{R2})^2 + (y_{An}-y_{R2})^2}$$

$$D_{AnR3} = \sqrt{(x_{An}-x_{R3})^2 + (y_{An}-y_{R3})^2}$$

. . .

$$D_{AnRm} = \sqrt{(x_{An}-x_{Rm})^2 + (y_{Am}-y_{Rm})^2}$$

The cooling load contributed by each AHU to each Rack in the Data Centre may be defined as $kW_{A1R1}$, $kW_{A1R2}$, $kW_{A1R3}$, $kW_{A1R4}$, . . . .

For Rack-1:

Cooling Load contributed by $A1$ to $R1$:

$$kW_{A1R1} = \frac{kW_{A1}}{D_{A1R1}\left[\frac{1}{D_{A1R1}} + \frac{1}{D_{A1R2}} + \frac{1}{D_{A1R3}} + \ldots + \frac{1}{D_{A1Rm}}\right]}$$

Cooling Load contributed by $A2$ to $R1$:

$$kW_{A2R1} = \frac{kW_{A2}}{D_{A2R1}\left[\frac{1}{D_{A2R1}} + \frac{1}{D_{A2R2}} + \frac{1}{D_{A2R3}} + \ldots + \frac{1}{D_{A2Rm}}\right]}$$

Cooling Load contributed by $A3$ to $R1$:

$$kW_{A3R1} = \frac{kW_{A3}}{D_{A3R1}\left[\frac{1}{D_{A3R1}} + \frac{1}{D_{A3R2}} + \frac{1}{D_{A3R3}} + \ldots + \frac{1}{D_{A3Rm}}\right]}$$

Cooling Load contributed by $An$ to $R1$:

$$kW_{AnR1} = \frac{kW_{An}}{D_{AnR1}\left[\frac{1}{D_{AnR1}} + \frac{1}{D_{AnR2}} + \frac{1}{D_{AnR3}} + \ldots + \frac{1}{D_{AnRm}}\right]}$$

For Rack-2:

Cooling Load contributed by $A1$ to $R2$:

$$kW_{A1R2} = \frac{kW_{A1}}{D_{A1R2}\left[\frac{1}{D_{A1R1}} + \frac{1}{D_{A1R2}} + \frac{1}{D_{A1R3}} + \ldots + \frac{1}{D_{A1Rm}}\right]}$$

Cooling Load contributed by $A2$ to $R2$:

$$kW_{A2R2} = \frac{kW_{A2}}{D_{A2R2}\left[\frac{1}{D_{A2R1}} + \frac{1}{D_{A2R2}} + \frac{1}{D_{A2R3}} + \ldots + \frac{1}{D_{A2Rm}}\right]}$$

Cooling Load contributed by $A3$ to $R2$:

$$kW_{A3R2} = \frac{kW_{A3}}{D_{A3R2}\left[\frac{1}{D_{A3R1}} + \frac{1}{D_{A3R2}} + \frac{1}{D_{A3R3}} + \ldots + \frac{1}{D_{A3Rm}}\right]}$$

Cooling Load contributed by $An$ to $R2$:

$$kW_{AnR2} = \frac{kW_{An}}{D_{A1R2}\left[\frac{1}{D_{AnR1}} + \frac{1}{D_{AnR2}} + \frac{1}{D_{AnR3}} + \ldots + \frac{1}{D_{AnRm}}\right]}$$

For Rack-m:

Cooling Load contributed by $A1$ to $Rm$:

$$kW_{A1Rm} = \frac{kW_{A1}}{D_{A1Rm}\left[\frac{1}{D_{A1R1}} + \frac{1}{D_{A1R2}} + \frac{1}{D_{A1R3}} + \ldots + \frac{1}{D_{A1Rm}}\right]}$$

Cooling Load contributed by $A2$ to $Rm$:

$$kW_{A2Rm} = \frac{kW_{A2}}{D_{A2Rm}\left[\frac{1}{D_{A2R1}} + \frac{1}{D_{A2R2}} + \frac{1}{D_{A2R3}} + \ldots + \frac{1}{D_{A2Rm}}\right]}$$

Cooling Load contributed by $A3$ to $Rm$:

$$kW_{A3R1} = \frac{kW_{A3}}{D_{A3Rm}\left[\frac{1}{D_{A3R1}} + \frac{1}{D_{A3R2}} + \frac{1}{D_{A3R3}} + \ldots + \frac{1}{D_{A3Rm}}\right]}$$

-continued

Cooling Load contributed by $An$ to $Rm$:

$$kW_{AnRm} = \frac{kW_{An}}{D_{AnRm}\left[\frac{1}{D_{AnR1}} + \frac{1}{D_{AnR2}} + \frac{1}{D_{AnR3}} + ... + \frac{1}{D_{AnRm}}\right]}$$

The zone of influence for each rack can then be determined by the AHU making the highest cooling load contribution. This AHU can then be identified as a primary candidate for any alert to indicate the potential cause of a temperature measurement being outside of a predetermined range.

In a general aspect therefore, when an alert message is derived by the computer model from a correlation over time between the inlet air temperature for the rack and one of the received measurements, the air handling unit having a highest cooling load contribution to the rack may be identified as the cause of the level or rate of change of inlet air temperature being outside of a preset range for the rack. The cooling load contribution by each air handling unit to the rack may be calculated based on a distance from the rack to each air handling unit weighted by a cooling power of each handling unit, as for example calculated according to the procedure described above.

The computer model of the data centre may also comprise information relating to the location of each of the display modules. Upon installation of each display module, a location may be input to indicate where in the data centre the display module is located, for example in the form of rack and row numbers. The display module may transmit this location information, for example when transmitting temperature information. The computer model will cause an alert message to be transmitted to a display module if the information being transmitted does not correspond with the location information stored in the model, indicating that there is a problem with either the display module being in the wrong location or that the information in the computer model is incorrect.

Other embodiments are intentionally within the scope of the invention as defined by the appended claims.

The invention claimed is:

1. A method of monitoring a cooling system comprising one or more air handling units configured to provide air flow cooling to a plurality of racks of computer equipment, each rack having a display module for indicating an inlet air temperature of the rack and an alert message, the method comprising the following acts performed by a computer:
receiving, from a plurality of sensors, measurements of:
an air flow temperature provided to each of the plurality of racks; and
an air pressure, temperature and relative humidity difference across the one or more air handling units, and
an electrical power consumption of the one or more air handling units;
updating a computer model of the cooling system with the received measurements;
using the computer model to derive an alert message for each rack in response to a level or a rate of change of the inlet air temperature being outside of a preset range for the rack, wherein the alert message is derived from a measurement of the received measurements, which is selected as having a highest correlation with the inlet air temperature for the rack as compared to at least one other of the received measurements, the alert message indicating a location from which the selected measurement was taken; and
transmitting the alert message to the display module to indicate a cause based on the computer model.

2. The method of claim 1 wherein the alert message is transmitted in response to the level or rate of change of the inlet air temperature exceeding a preset limit for the rack.

3. The method of claim 1 comprising transmitting a signal to the display module on each rack to indicate the inlet air temperature of the rack.

4. The method of claim 1 wherein the air flow temperature for each of the plurality of racks is measured and transmitted by the display module for that rack.

5. The method of claim 1, comprising selecting by the computer model a plurality of the received measurements having higher correlations with the inlet air temperature for the rack with respect to at least one other of the received measurements, the alert message indicating the locations for the selected plurality of the received measurements in order of correlation.

6. The method of claim 1, comprising measuring correlation for each inlet air temperature against each measurement from the plurality of sensors over a preceding period of time.

7. The method of claim 6 wherein the measuring of correlation is determined from frequency analysis of pairs of data sets, each data set pair comprising time varying data of an inlet air temperature and a measurement from the respective sensor.

8. The method of claim 6 wherein the measure of correlation is stored in a table from which the correlation over time between the inlet air temperature for the rack and the selected received measurement is obtained.

9. The method of claim 1, wherein the selected measurement corresponds to the measurement received from the sensor of a respective air handling unit of the one or more air handling units, and the computer model identifies the respective air handling unit as the cause.

10. The method of claim 1, wherein the selected measurement corresponds to the measurement received from the sensor of a respective air handling unit of the one or more air handling units which has a highest cooling load contribution to the rack, and wherein the computer model identifies the respective air handling unit as the cause.

11. The method of claim 10, comprising calculating a respective cooling load contribution by each of the one or more air handling units to the rack based on a distance from the rack to the respective air handling unit weighted by a cooling power of the respective air handling unit.

12. The method of claim 1 wherein the alert message transmitted to the display module indicates the cause of the preset range being exceeded for the rack.

13. The method of claim 1 comprising:
each display module transmitting a respective first indication of its location,
making a comparison between the first indication and a second indication of a location of the respective display module in the computer model, and
the respective display module displaying an alarm in response to the first and second indications not matching.

14. A non-transitory computer-readable medium comprising instructions stored thereon, which when executed by a computer, configure the computer to perform a method of monitoring a cooling system comprising one or more air handling units configured to provide air flow cooling to a plurality of racks of computer equipment, each rack having a display module for indicating an inlet air temperature of the rack and an alert message, the instructions configuring the computer to perform acts comprising:

receiving, from a plurality of sensors, measurements of:
      an air flow temperature provided to each of the plurality of racks; and
      an air pressure, temperature and relative humidity difference across the one or more air handling units, and an electrical power consumption of the one or more air handling units;
   updating a computer model of the cooling system with the received measurements;
   using the computer model to derive an alert message for each rack in response to a level or a rate of change of the inlet air temperature being outside of a preset range for the rack, wherein the alert message is derived from a measurement of the received measurements, which is selected as having a highest correlation with the inlet air temperature for the rack as compared to at least one other of the received measurements, the alert message indicating a location from which the selected measurement was taken; and
   transmitting the alert message to the display module to indicate a cause based on the computer model.

15. A method of monitoring a cooling system comprising one or more air handling units configured to provide air flow cooling to a plurality of racks of computer equipment, each rack having a display module for indicating an inlet air temperature of the rack and at least one alert message, the method comprising the following acts performed by a computer:

receiving, from a plurality of sensors, measurements of:
      an air flow temperature provided to each of the plurality of racks; and
      an air pressure, temperature and relative humidity difference across the one or more air handling units, and an electrical power consumption of the one or more air handling units;
   receiving from each display module a respective first indication of its location;
   updating a computer model of the cooling system with the received measurements;
   using the computer model to derive a first alert message for each rack in response to a level or a rate of change of the inlet air temperature being outside of a preset range for the rack;
   transmitting the first alert message to the display module to indicate a cause based on the computer model;
   comparing the first indication and a second indication of a location of the respective display module in the computer model; and
   transmitting a second alert message to the respective display module for displaying an alarm in response to the first indication not matching the second indication.

\* \* \* \* \*